United States Patent [19]

Trent et al.

[11] Patent Number: 5,185,874
[45] Date of Patent: Feb. 9, 1993

[54] ADDRESS GENERATOR FOR HIGH SPEED DATA AVERAGER

[75] Inventors: William A. Trent, Bend; Mark Marineau, Redmond, both of Oreg.

[73] Assignee: Tektronix, Inc., Wilsonville, Oreg.

[21] Appl. No.: 428,534

[22] Filed: Oct. 30, 1989

[51] Int. Cl.$^5$ .............. G06F 9/26; G01R 13/00; G01R 23/6
[52] U.S. Cl. .............. 395/400; 364/487; 364/DIG. 1
[58] Field of Search .............. 395/400; 364/200 MS File, 900 MS File, 487; 365/230.08

[56] References Cited

U.S. PATENT DOCUMENTS

| | | | |
|---|---|---|---|
| 4,495,586 | 1/1985 | Andrews | 364/487 |
| 4,604,736 | 8/1986 | Demevre | 367/123 |
| 4,755,951 | 7/1988 | Hollister | 364/487 |
| 4,791,404 | 12/1988 | Hollister | 364/178 X |
| 4,799,165 | 1/1989 | Hollister et al. | 364/487 |
| 4,825,379 | 4/1989 | Luthra et al. | 364/487 |
| 4,873,646 | 10/1989 | Stoops | 364/487 |
| 4,982,387 | 1/1991 | Trent | 368/117 |
| 5,050,065 | 9/1991 | Dartois et al. | 364/200 |
| 5,058,076 | 10/1991 | Kiuchi | 365/230.08 X |

Primary Examiner—Joseph L. Dixon
Assistant Examiner—Michael A. Whitfield
Attorney, Agent, or Firm—Francis I. Gray; William K. Bucher

[57] ABSTRACT

An address generator that provides equivalent time sampling for a time domain reflectometer generates read and write addesses for simultaneous application to an aquisition memory over an address bus. For each iteration of a repetitive input signal an excitation pulse is delayed by an amount, dt, that is an integer submultiple of a sampling period, T. Read addresses for each iteration of the repetitive input signal start from an initial address and increment by T/dt for each data sample. Corresponding write addresses are generated from the read addresses one sample time later so that the address on the address bus has a read address that is one address ahead of the write address. The acquisition memory reads out data from the read address for accumulation with corresponding sampled data while accumulated data is being input to the write address.

7 Claims, 7 Drawing Sheets

ADDRESS GENERATOR FOR HIGH SPEED DATA AVERAGER

BACKGROUND OF THE INVENTION

The present invention relates to memory address generators, and more particularly to an address generator for a high speed data averager where a repetitive input signal is sampled in an equivalent time mode.

In the digital oscilloscope arts to digitize high frequency signals an equivalent time mode is used. In this mode a sample clock is skewed from a trigger event for successive iterations of a repetitive signal. A memory control circuit adds an increment to the address for each data sample so that the samples for each iteration of the signal occur in a memory spaced apart by the increment. The clock is skewed so that for the next iteration of the signal the data samples fall into the adjacent memory addresses to the prior data samples. The clock is successively skewed for successive iterations of the signal until all the memory locations are filled to give a complete picture of the signal waveform, which may then be displayed. Such an equivalent time mode system is described in U.S. Pat. No. 4,755,951 issued to Allen L. Hollister on Jul. 5, 1988 entitled "Method and Apparatus for Digitizing a Waveform."

The Hollister patent also describes two different modes for combining equivalent time sampling with hardware averaging, a spin mode for high frequency signals and a comb mode for lower frequency signals. In the spin mode the input waveform is sampled only once per repetitive waveform at the same relative location, divided and added to the contents of the current memory address, the address remaining unchanged until all samples are acquired. Then the current memory address is incremented by one and the next sample is taken from a delayed relative location, and the process of sampling, dividing, summing and storing into the current memory address is repeated. This process occurs for several points along the waveform. In the comb mode the input waveform is sampled many times during each repetitive input waveform and each sample is digitized, divided and summed with the contents of the current address which is incremented by the sampling interval for each successive sample. The address is reset to an initial address at the beginning of each waveform and the process is repeated until the necessary number of waveforms have been sampled at several similar points.

In a time domain reflectometer there are two sets of timing pulses generated, a pulse signal and a sample signal. The pulse signal activates an energy source, such as a laser for an optical time domain reflectometer or an electronic pulse circuit for a metallic time domain reflectometer, that transmits an energy pulse into a transmission line, either optical fiber or metallic. The sample signal is used to sample reflections and backscattered energy received from the transmission line in response to the energy pulse within a predetermined acquisition window. In co-pending U.S. patent application Ser. No. 07/399,663, filed Aug. 28, 1989 by William A. Trent entitled "Digital Time Base With Differential Period Delay," the sample clock is phase locked to a master oscillator and remains unchanged, while the pulse signal is delayed from pulse to pulse.

What is desired is an address generator for a high speed averager that applies equivalent time sampling techniques to a time domain reflectometer where the sample signal is not skewed.

SUMMARY OF THE INVENTION

Accordingly the present invention provides an address generator for a high speed averager that provides equivalent time sampling to effectively multiply the sampling rate for a repetitive input waveform to achieve a desired data density while averaging the samples with prior acquired samples at the same relative location of the input waveform to reduce noise. The address generator has a start address register and an address increment register that are loaded by a microprocessor prior to an acquisition period. The start address is loaded into an address counter at the beginning of a data acquisition cycle as an initial address. The initial address is transferred on a sample clock pulse to a read address latch that provides a read address to a memory during a read cycle. The read address is also input to an address adder where the address increment is added to the read address and transferred to the read address latch on the next sample clock pulse. Also on the next sample clock pulse the current read address is transferred to a write address latch that provides a write address to the memory during a write cycle. Thus on one read/write cycle data is being read out of the memory from one address while data is being written in at the previous address. Therefore data is read from memory on one sample clock pulse for addition to a current sample and is written back into the same address on the next sample clock pulse to provide data averaging concurrent with equivalent time sampling.

The objects, advantages and novel features of the present invention are apparent from the following detailed description when read in conjunction with the appended claims and attached drawing.

DESCRIPTION OF THE PREFERRED EMBODIMENT

Figure 1:
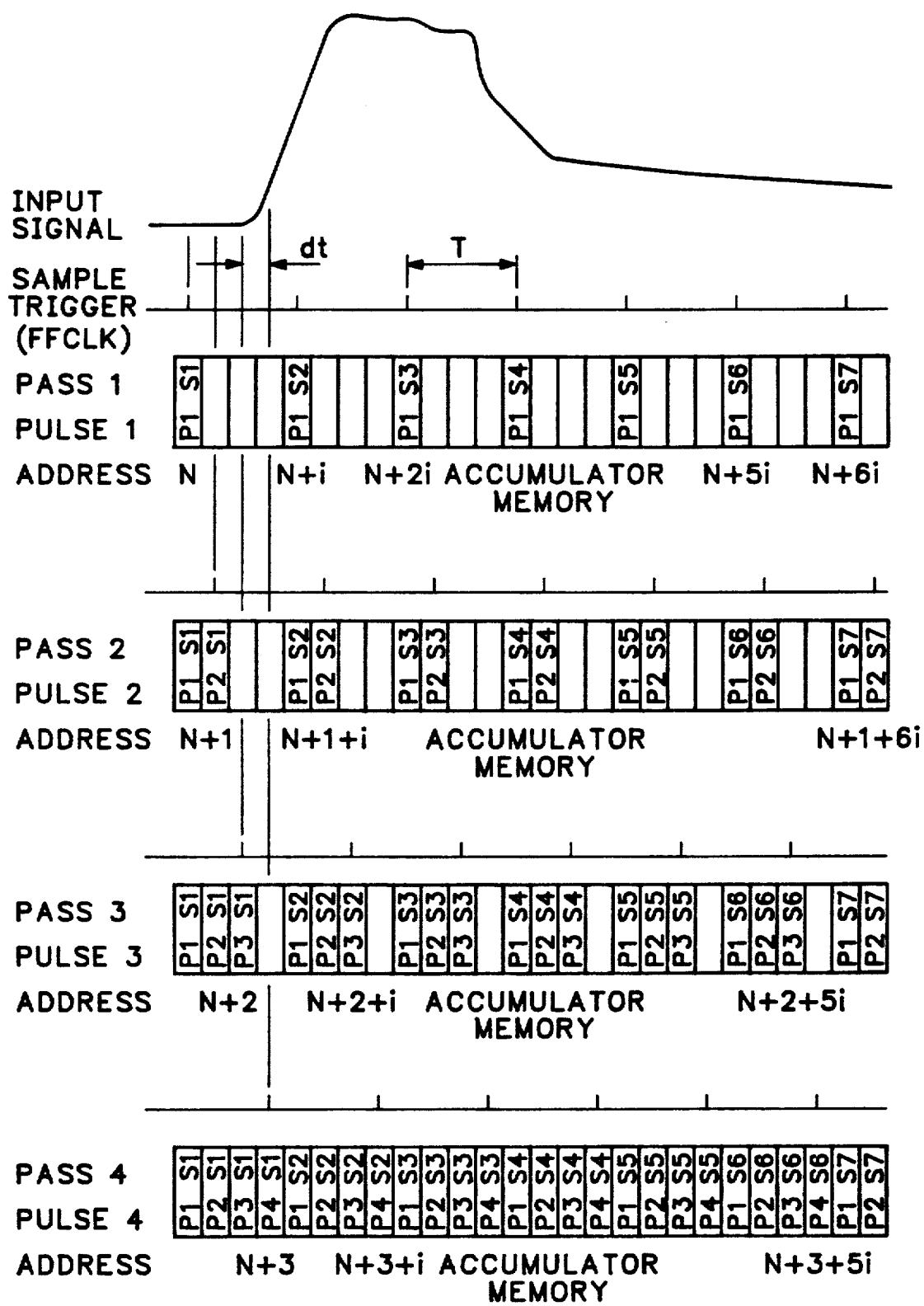
FIG. 1 is a graphic diagram of equivalent time sampling for a time domain reflectometer according to the present invention.

Referring now to FIG. 1 an input signal, having a waveform as shown, is received at the input of a time domain reflectometer in response to an energy pulse. The input signal is sampled at different times on consecutive passes within an acquisition window as is determined by the amount of delay of the energy pulse relative to a sample clock signal. After the first energy pulse in a series the input signal is sampled by the sample clock signal starting after a predetermined delay time determined by the acquisition window. The sampled data is stored for the first sample at memory address location N. The next data sample is stored at memory address location N+i, where i is an address increment that is a function of the energy pulse delay, dt, which in turn is an integer divisor of the sample clock period, T, to achieve a desired data density. For the example as shown in FIG. 1 the address increment is four, i.e., there are four passes, or iterations, of data before the sample data points relative to the input signal repeat. On the second pass the initial address is incremented by one corresponding to a next energy pulse delayed by dt, where $dt=T/4$, and the data samples are interleaved into the memory at adjacent locations to the previous pass. This routine repeats until the memory is full, completing an acquisition cycle, at which point data is written back over data already in memory, either to replace the old data or to be averaged with the old data. An acquisition period includes the number of acquisition cycles over which averaging of the data is desired.

Figure 2:
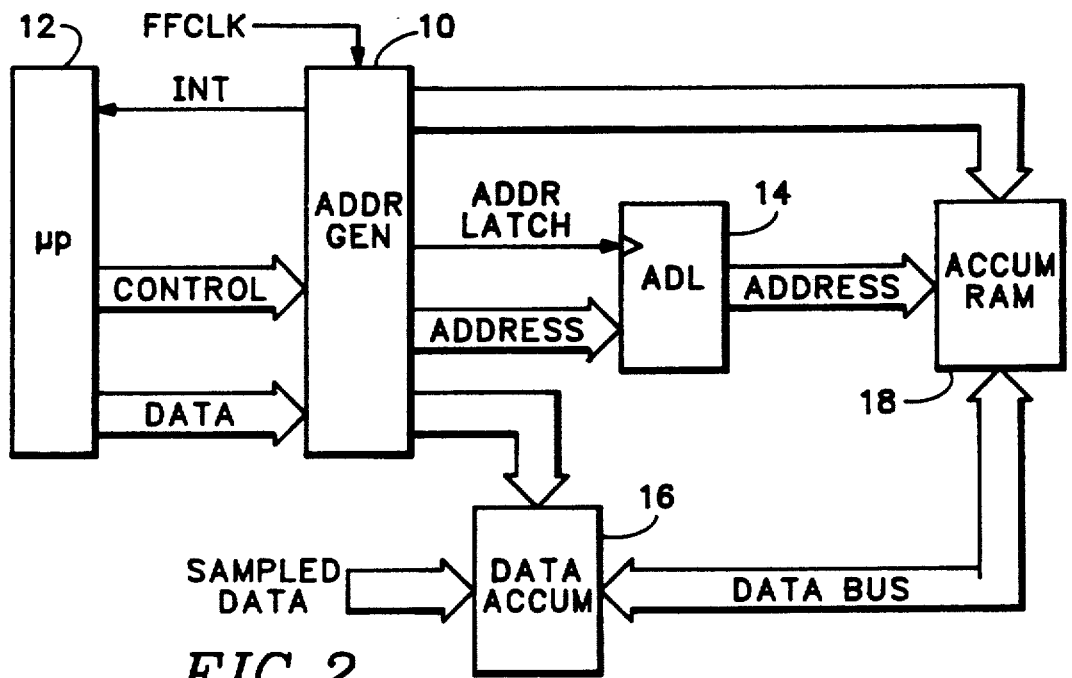
FIG. 2 is a block diagram view of an address generator with a high speed averager according to the present invention.

As shown in FIG. 2 an address generator 10 has parameter data input from a microprocessor 12 as well as control information to select the address generator chip and identify the devices within the address generator where the parameter data is to be loaded. The microprocessor 12 also receives an interrupt signal from the address generator when the acquisition period has been completed. Timing for the address generator 10 is provided by the sample clock signal, FFCLK, as well as from the microprocessor 12 control signals. The address generator 10 provides a read/write memory address to an address latch 14 together with a control signal, and provides control signals to a data accumulator 16 and to a memory 18, such as a random access memory, that stores the acquired data. Sampled data is input to the data accumulator 16 together with data from the memory 18, and the data are summed and stored back into the memory.

Figure 3:
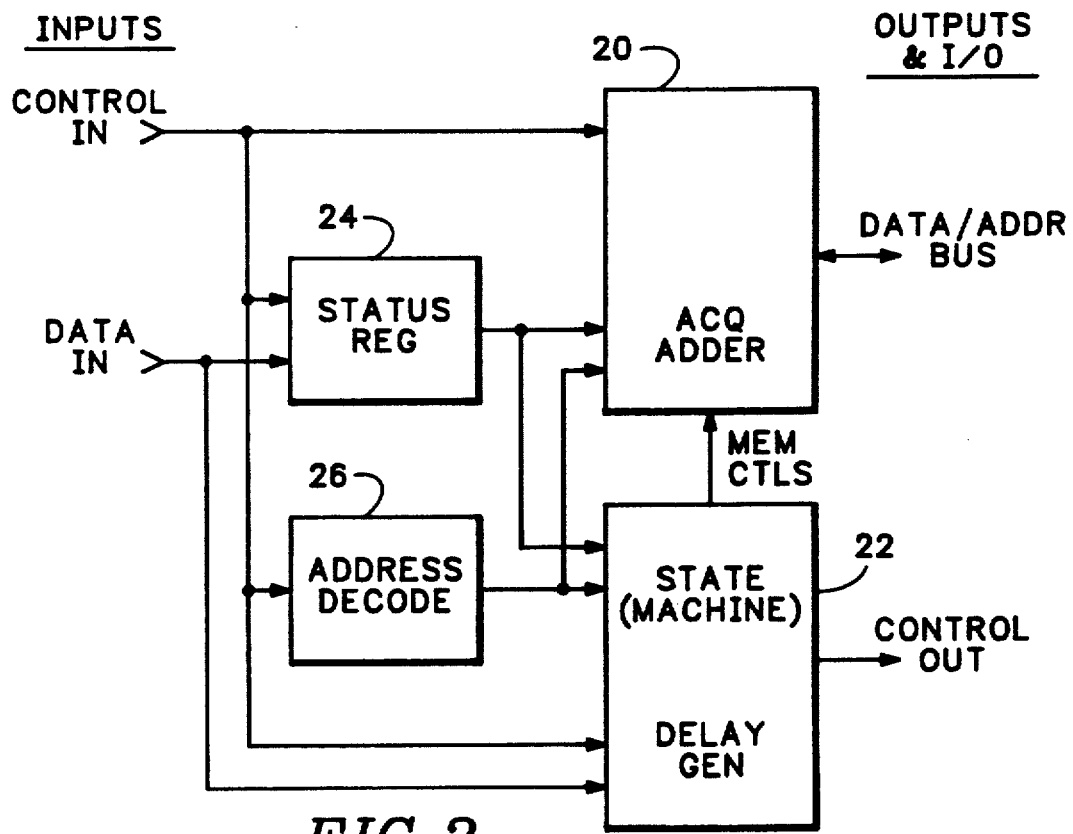
FIG. 3 is a block diagram of an integrated chip for implementing the address generator and data accumulator of FIG. 2.

FIG. 3 is a top level block diagram of an integrated circuit chip that may be used to implement the address generator 10 and/or the data accumulator 16. There are two main blocks, an acquisition adder 20 and a delay generator 22, and two minor blocks, a status register 24 and an address decoder 26. The functions of the status register 24 and the address decoder 26 are quite simple and not active in control or acquisition data manipulation. The status register 24 is used as chip control and consists of a latch. The address decoder 26 generates all register strobes for the integrated chip. The delay generator 22 is the main control system for the chip set, controlling front end acquisition strobes and timing relationships, as is described in the co-pending patent application supra. The acquisition adder 20 is the main data manipulator, acting as a data accumulator for averaging and as an address accumulator for the accumulator memory 18. The acquisition adder 20 acts under the timing and control restraints of the delay generator 22.

Figure 4:
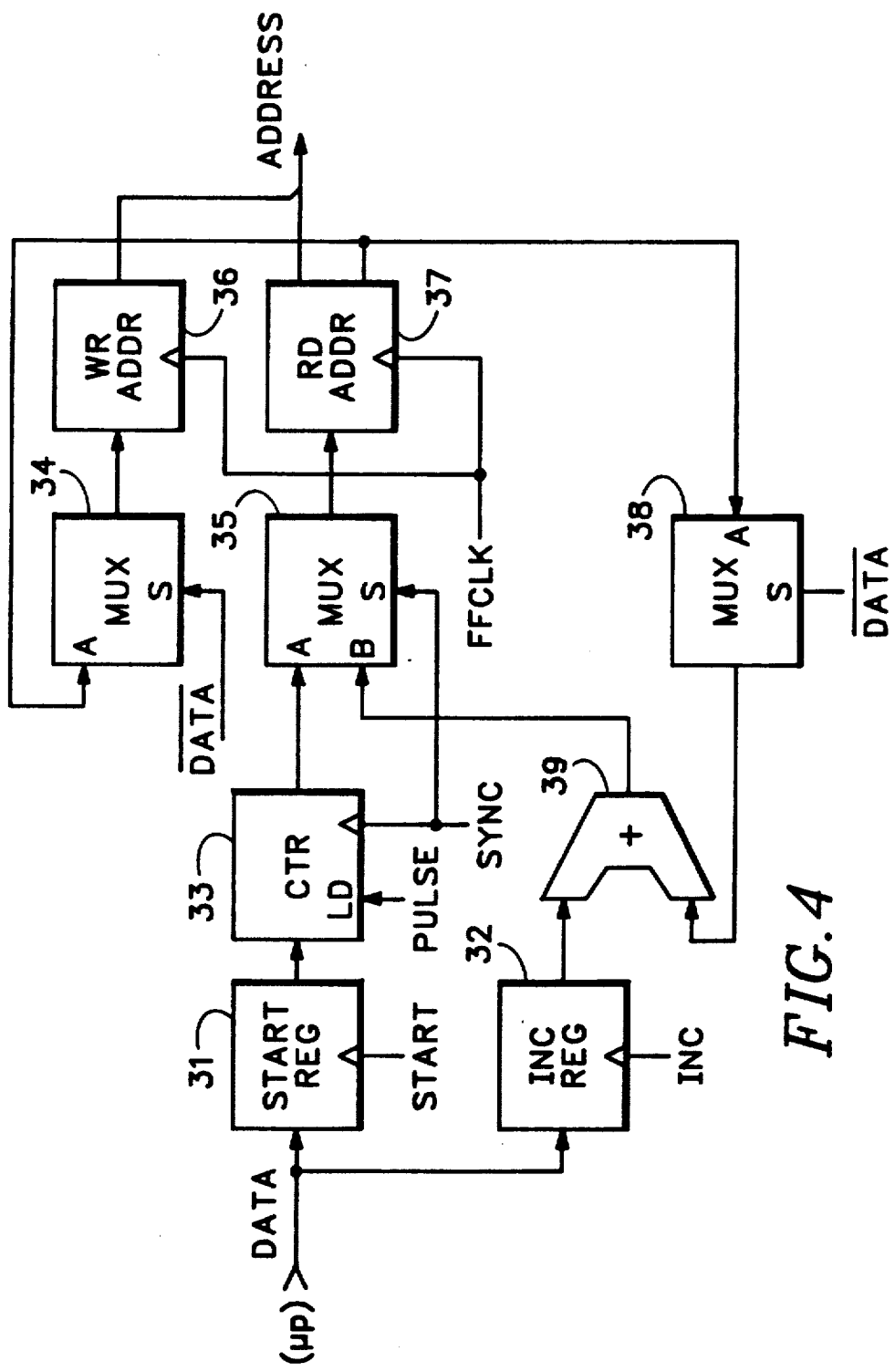
FIG. 4 is a block diagram of an acquisition adder portion of the address generator of FIG. 2.

In FIG. 4 the acquisition adder is configured as an address generator. Input parameters from the microprocessor 12 are input to a start address register 31 and to an address increment register 32. Start and Increment pulses derived from the microprocessor control inputs by the address decoder 26 load the start register 31 with a starting address for the accumulation memory 18 and the address increment register 32 with an address increment prior to an acquisition period to achieve the desired data density in the memory. At the beginning of an acquisition cycle having T/dt passes a dither signal loads the start address, N, from the start address register 31 into a counter 33 during an acquisition sync pulse. The start address from the counter 33 is passed through a multiplexer 35 during the acquisition sync pulse to a read address latch 37. On a first flip-flop clock pulse, FFCLK, after the start of the acquisition window the start address is loaded into the read address latch 37 and made available on the lower half of the output data/address bus. The address from the read address register 37 is applied via another multiplexer 34 to a write address latch 36. The address is latched into the write address latch 36 on the following flip-flop clock pulse and made available on the upper half of the output data/address bus so that the address on the address bus has a current read address and a prior write address.

The address from the read address register 37 also is input via another multiplexer 38 to an adder 39. The adder 39 combines the address increment from the address increment register 32 with the address from the read address register 37 and applies the incremented address, N+i, back to the read address latch 37 via the multiplexer 35. Therefore after the start of the acquisition window the addresses on the address bus increment on each flip-flop clock pulse. At the beginning of the next pass following the next energy pulse, the acquisition sync pulse occurs again and increments the counter 33 to provide a new start address, N+1, to the read address latch 37 and the process repeats. Once i passes have been completed, the dither signal occurs again to reload the counter 33 with the start address from the start address register 31 to start the acquisition cycle again. Due to the pipeline through the data accumulator 16, as explained in greater detail below, read addressing to the memory 18 leads the write addressing. This allows the data value to be read from memory 18, added to an external data value and then placed back into the same location of the memory. The cycle processes data as: read 1, write 0; read 2, write 1, . . . , read n, write n−1.

Figure 5:
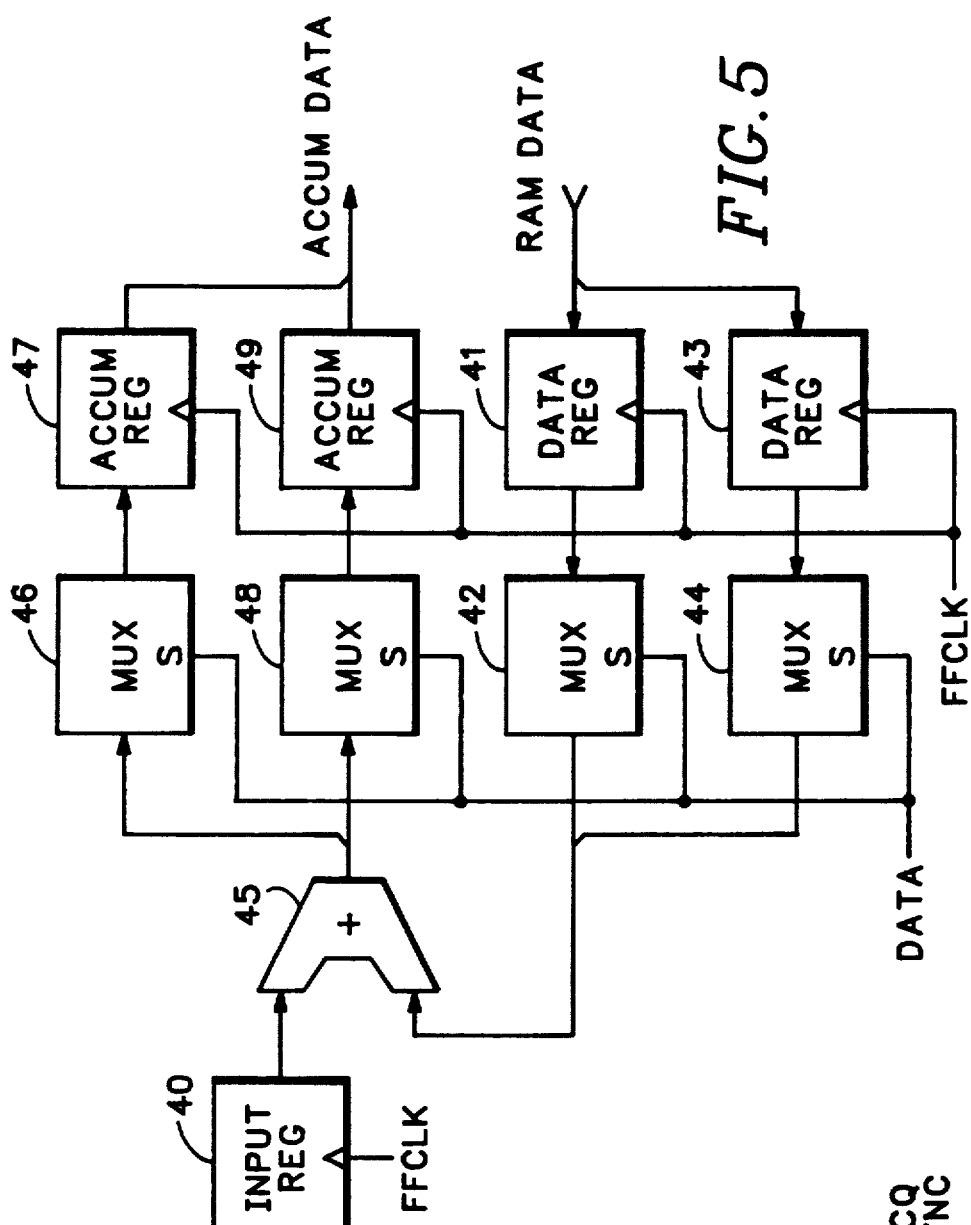
FIG. 5 is a block diagram of an acquisition adder portion of the data accumulator for the high speed averager of FIG. 2.

The acquisition adder 20, configured as a data accumulator, is shown in FIG. 5. Sampled data is input over the input data bus to an input data register 40. During a read cycle data is read from the memory 18 into the memory data registers 41, 43 from the address accessed by the read address on the address data bus. The data is passed through multiplexers 42, 44 to a data adder 45 where it is combined with the current sampled data in the input data register 40. The combined data is then latched into accumulation registers 47, 49 via multiplexers 46, 48 on the following clock cycle to be read back into the same address location of the memory 18 from which the memory data portion was obtained. In this manner each memory location represents a sum of the data for that respective point of the input signal over many iterations according to the desired acquisition period.

For further processing after the completion of the acquisition period the data in the memory 18 is then transferred to a processor memory 50, which transfer may be made at a slower rate than the acquisition of the data. During a data transfer memory switches 52, 54 on the data and address busses, in response to a memory transfer command, MEMX , allow the transfer to occur, the direction of the transfer being determined by a low speed output enable command, LSROE . The same MEMX command via switches 56, 58 inhibits control by the processor 12 of the buffer memory 50 during the data transfer. The addresses for both memories 18, 50 are generated by the address generator 10, but at a slower rate than for data acquisition. When data is not being transferred between the memories 18, 50, then switches 52, 54 inhibit access to the buffer memory 50 by the address and data busses and switches 56, 58 allow access by the processor 12, with a low speed write command, LSRWR , indicating the direction of transfer between the buffer memory and the processor. With the data transferred to the buffer memory the data may be processed prior to display while another acquisition period occurs.

Figure 6:
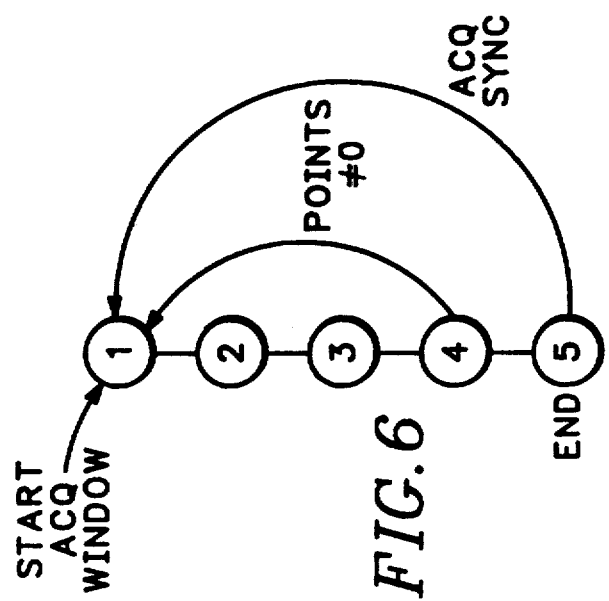
FIG. 6 is a state diagram for normal data acquisition according to the present invention.
Figure 7:
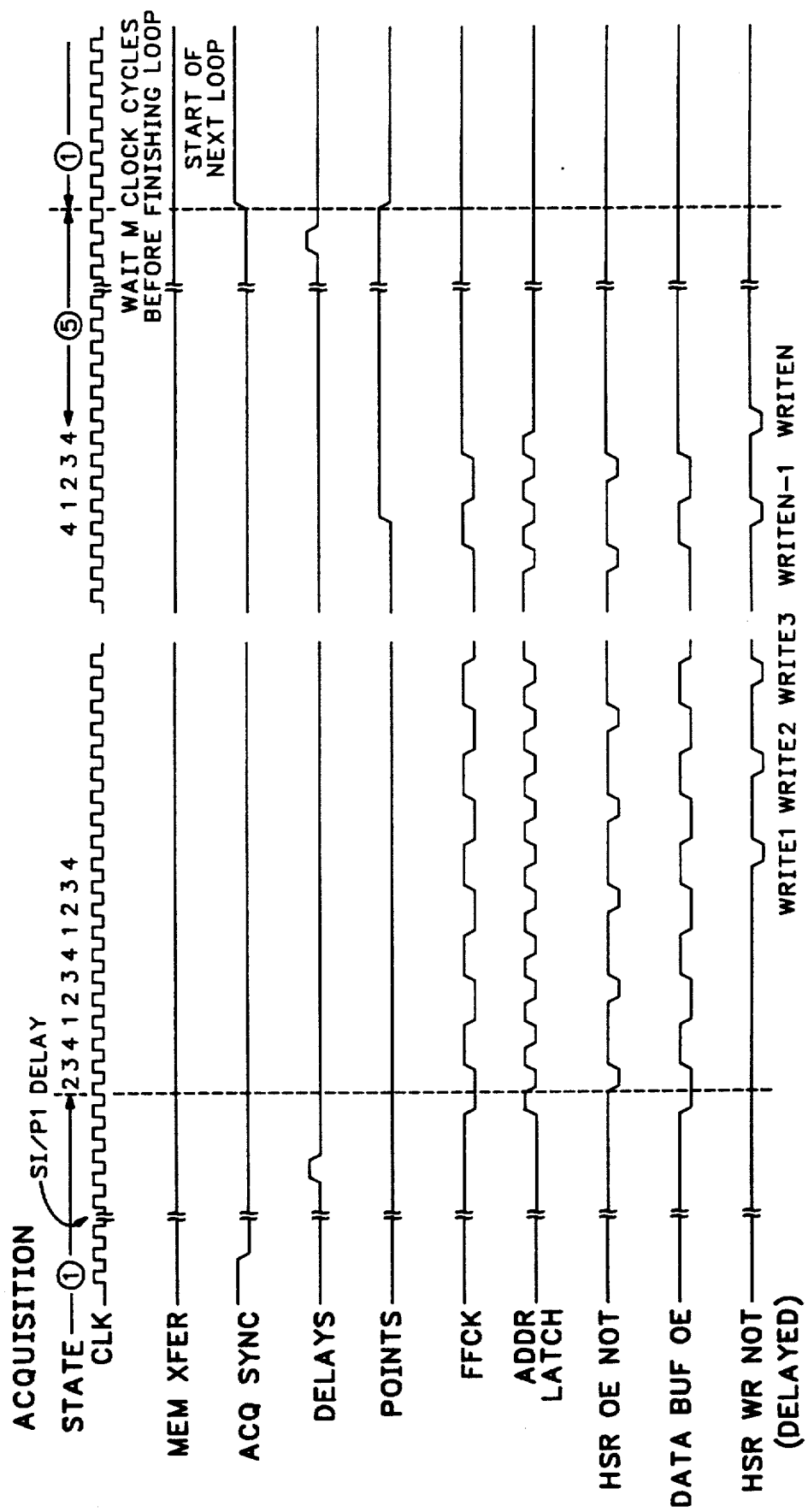
FIG. 7 is a timing diagram for normal data acquisition according to the present invention.
Figure 8:
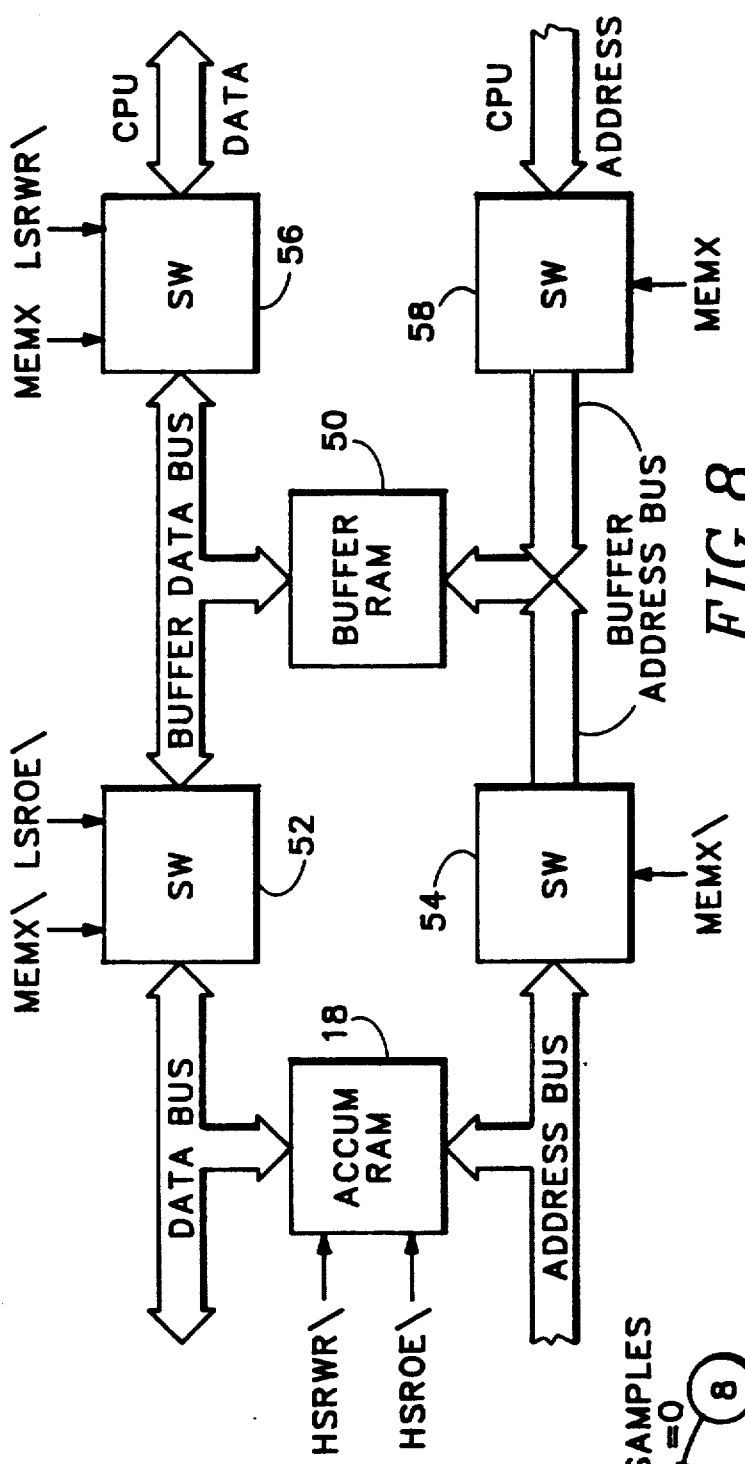
FIG. 8 is a block diagram of a dual memory system for transferring data from the high speed averager memory to a processor memory according to the present invention.

As shown in FIGS. 6 and 7 the normal acquisition loop of the acquisition state machine in the delay generator 22 for the address generator 10 has five states. ACQ SYNC resets this state machine to the first state where it is held until the opening of the acquisition window for taking samples from the input signal. In the first state all the signal lines are held in an "idle" state. In this state the output of the data accumulator 16 and address generator 10 are enabled. During a high speed write to the accumulator memory 18, this state completes a write cycle. The transition from state one to state two causes several actions to occur. The sampled data is transferred to the input data register 40, the accumulator memory read address is latched into the output address latch 14, and a points or sample counter in the delay generator is decremented. The zero output of the sample counter indicates that this is the last sample for the current excitation pulse and data acquisition for that pulse is ended. In state two the data output of the data accumulator 16 and the address output of the address generator 10 are disabled to avoid driving the accumulator memory data and internal address bus when output of the memory 18 is enabled. The write address is now placed on the internal address bus in preparation for the next cycle. State three enables the output of the accumulator memory 18 and the write address latch 36 output. States two and three generate the memory write pulse.

The transition from state three to four causes the data from the previous sample to be latched into the data accumulator 16 and write address to be latched in the address latch 14. Also the results of the next read address calculation are placed on the internal address bus. In state four an accumulator memory write cycle begins. If the samples for the current pulse are complete, then state five is entered on the next clock pulse; otherwise the cycle is repeated for the next sample by returning to state one on the next clock pulse. State five is the terminal state and all signals are returned to their idle state levels. State five is reset to state one when it is reset by the next ACQ SYNC.

Figure 9:
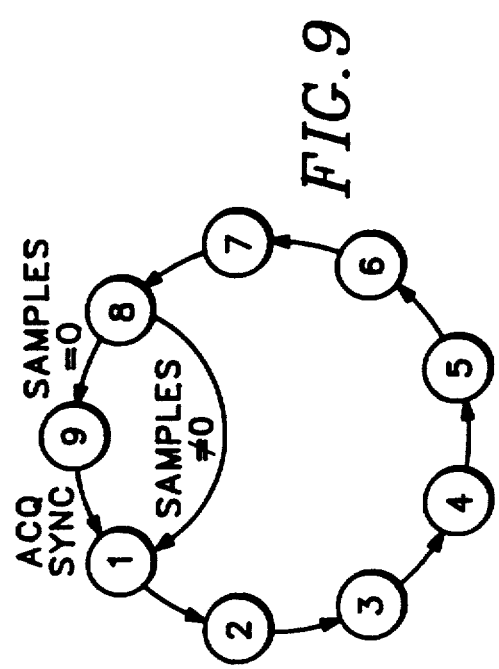
FIG. 9 is a state diagram for the data transfer of FIG. 8.
Figure 10:
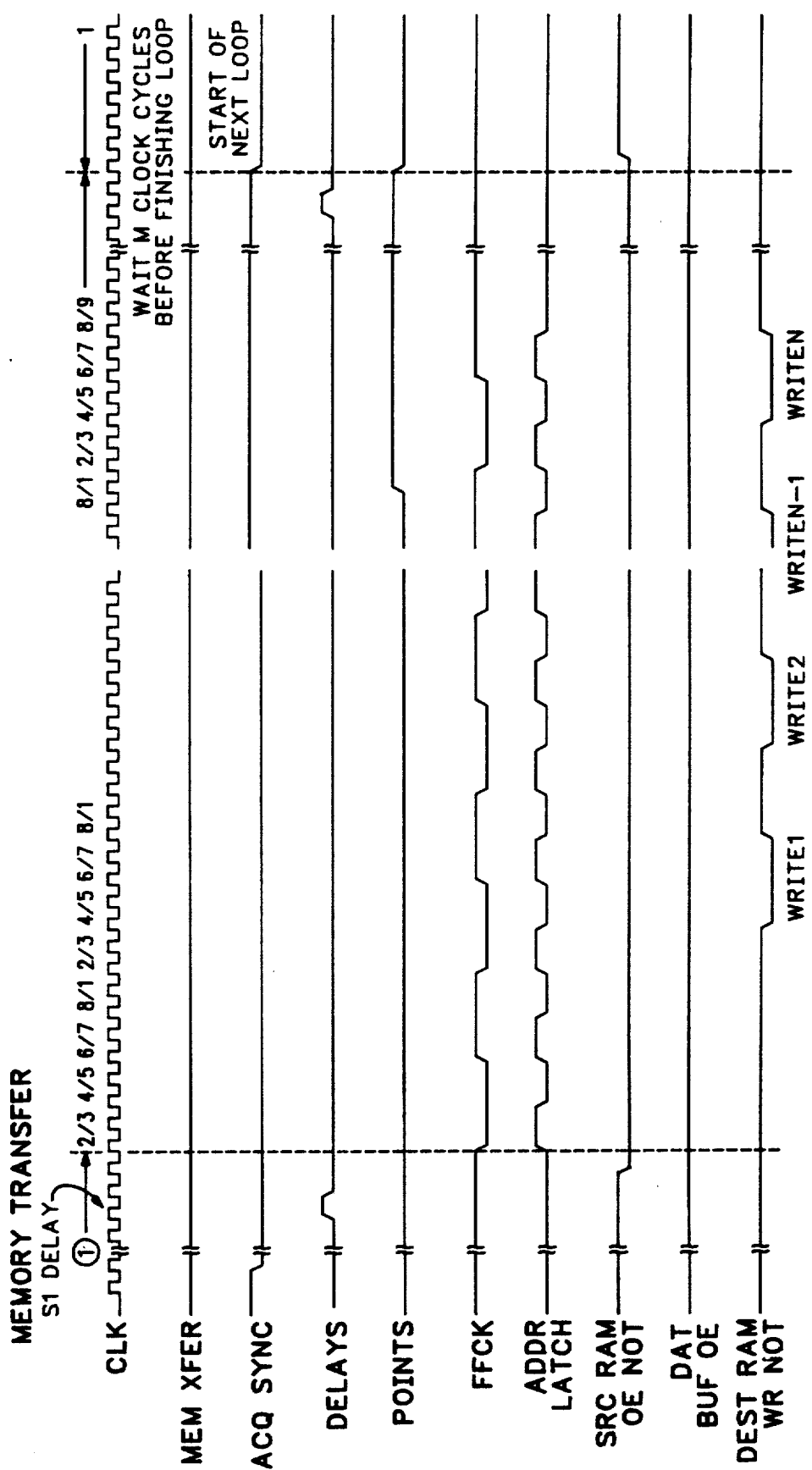
FIG. 10 is a timing diagram for the data transfer of FIG. 8.

Referring now to the state diagram of FIG. 9 and the timing diagram of FIG. 10 a memory transfer is illustrated. After the acquisition period is complete the data is transferred from the memory 18 to the lower speed buffer memory 50 to allow the microprocessor 12 to access the data while new data is being acquired during a subsequent acquisition period. During this transfer, as discussed above, the microprocessor 12 is locked out of the buffer memory 50. The two memories 18, 50 are addressed in parallel and the data output of the source memory and the address latch output are enabled for the duration of the transfer cycle. The basic operation performed is to address the memories 18, 50, to wait for data from the source memory to stabilize, to write the data to the destination memory, and then to increment the address for the next data word. Additional states are added to the state machine to double the amount of time for a full cycle of the state machine. This allows a slower memory to be used for the buffer memory 50. The write cycle begins after the same number of clock cycles as in normal acquisition mode, i e., the write cycle is delayed. The memory transfer loop has nine states. ACQ SYNC resets the state machine to the first state where it is held until the acquisition window is reached. All the signal lines are held in an "idle" state. Transition from state one to state two causes the memory address to be latched, and decrements the sample counter. The transition from state five to state six begins the next address calculation. States two through five generate the destination memory write pulse. This pulse occurs during states four through seven of a later state machine cycle. State nine is the terminal state of the machine. All signals are returned to their idle levels, and the state machine remains in this state until it is reset by ACQ SYNC.

Thus the present invention provides an address generator for a high speed signal averager that uses equivalent time sampling while performing signal averaging by slewing an energy pulse rather than a sample clock and pipelining the data to be averaged. The data is transferred at a slower rate to a buffer memory between acquisition periods for further processing while a subsequent acquisition is occurring.

What is claimed is:

1. An address generator for an acquisition memory to provide equivalent time sampling comprising:
    means for incrementing a start address to provide an initial address starting with the start address for each iteration of a repetitive input signal during an acquisition cycle that includes a predetermined number of iterations of the repetitive input signal to fill the acquisition memory;
    means for generating read addresses beginning with the initial address for each sample clock pulse within an acquisition window, the acquisition window occurring for each iteration of the repetitive input signal and each read address being separated from the prior read address by an address increment value;
    means for generating write addresses corresponding to the read addresses one sample clock pulse after the corresponding read addresses; and
    means for outputting the read and write addresses simultaneously onto an address bus for the acquisition memory where the read addresses lead the write addresses by the address increment value during each acquisition window.

2. An address generator as recited in claim 1 wherein the read address generating means comprises:
    a read latch having as an initial input the initial address;

an adder for summing the output of the read latch with the address increment value, the incremented address being input to the read latch after the initial address;

whereby on a first sample clock pulse within an acquisition window for a particular iteration of the repetitive input signal the initial address is latched into the read latch for output onto the address bus, and for each subsequent sample clock pulse the incremented address is latched into the read latch for output onto the address bus.

3. An address generator as recited in claim 2 wherein the write address generating means comprises a write latch having as input the output of the read latch so that the read address from the read latch is latched into the write latch as the write address for output onto the address pulse on a sample clock pulse subsequent to the sample clock pulse that latched the read address into the read latch.

4. An address generator as recited in claim 1 further comprising means for accumulating data in the acquisition memory in response to the read and write addresses, data being read from a memory location defined by the read address during a read cycle of the acquisition memory for summation with sampled data from a corresponding location on the repetitive input signal while accumulated data is written into a memory location defined by the write address during a write cycle of the acquisition memory.

5. An address generator as recited in claim 4 wherein the accumulating means comprises:
means for latching data from the acquisition memory and from the repetitive input signal on one sample clock pulse;
means for adding the data from the latching means together to produce the accumulated data; and
means for latching the accumulated data for output to the acquisition memory on a second sample clock pulse.

6. An address generator as recited in claim 1 further comprising means for storing the start address and the address increment value prior to an acquisition period, an acquisition period corresponding to a predetermined number of acquisition cycles.

7. A method of generating addresses for an acquisition memory comprising the steps of:
(a) prior to an acquisition period loading a start address and an address increment into respective registers;
(b) at the start of an acquisition cycle loading the start address into a counter as an initial address;
(c) transferring the initial address to a first latch as a read address on a first sample clock pulse within an acquisition window;
(d) adding the address increment to the read address;
(e) on a next sample clock pulse transferring the read address to a second latch as a write address and transferring the incremented read address to the first latch as the read address;
(f) providing the read and write address simultaneously onto an address bus for the acquisition memory;
(g) repeating steps (d), (e) and (f) on each subsequent sample clock pulse until the end of the acquisition window;
(h) incrementing the counter after the end of the acquisition window for incrementing the initial address to be the initial address for the next acquisition window;
(i) repeating steps (c) through (h) until the acquisition cycle is complete;
(j) repeating steps (b) through (i) until the acquisition period if complete.

* * * * *